Figure 1:
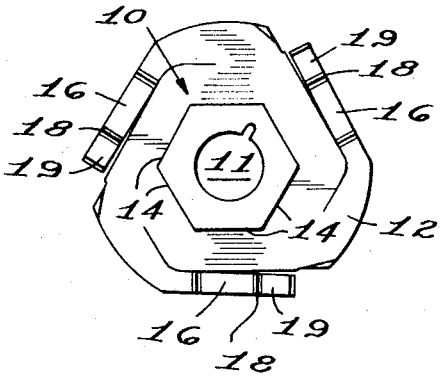
Figure 2:
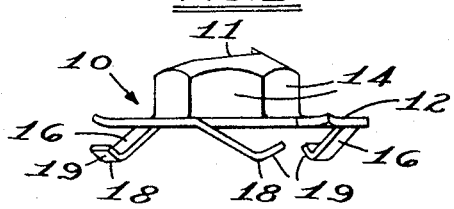
Figure 3:
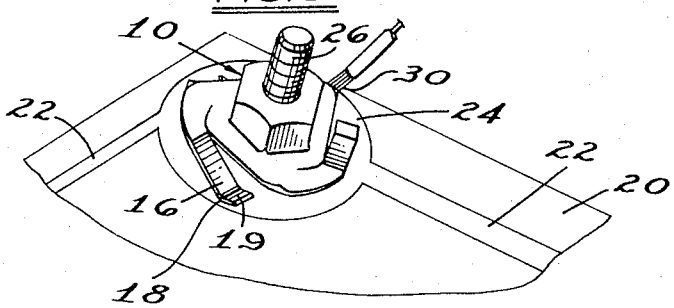

T861012

DEFENSIVE PUBLICATION

UNITED STATES PATENT OFFICE

Published at the request of the applicant or owner in accordance with the Notice of Apr. 11, 1968, 849 O.G. 1221. Identification is by serial number of the application and the heading indicates the number of pages of specification, including claims, and of sheets of drawing contained in the application as originally filed. The file of this application is available to the public for inspection; reproduction may be purchased for 30 cents per sheet.

Applications published under the Defensive Publication Program have not been examined as to the merits of alleged invention. The Patent Office makes no assertion as to the novelty of the disclosed subject matter.

PUBLISHED APRIL 1, 1969

861 O.G. 19

781,089
FASTENER FOR PRINTED CIRCUIT BOARDS
Philip Mendola, 8643 Balboa Drive, Utica, Mich. 48087
Filed Dec. 4, 1968. Published Apr. 1, 1969
Class 339—17
1 Sheet Drawing. 5 Pages Specification

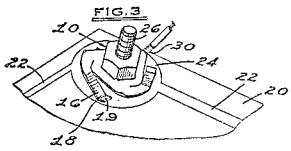

Resilient electrically conducting fingers formed on the flange of a threaded fastener contact the metal foil of a printed circuit board when the threaded fastener is tightened to hold an external lead on the board. A reverse curve in the ends of the fingers permits tightening and removal without scraping the foil off the circuit board. Finger ends extend upward beyond the curve to a height at least equal to the diameter of the external lead. The flange surrounds the wrenching surfaces of the fastener to prevent damaging the foil with the tightening tool, and the fingers are stamped from the edge of the flange. Each finger forms an angle of about 30° with the flange and each finger end curves toward the flange for about 0.2 inch, with the curved end also forming an angle of about 30° with the flange.

T861012

April 1, 1969 P. MENDOLA DEF. PUB.

FASTENER FOR PRINTED CIRCUIT BOARDS SN - 781089

Filed Dec. 4, 1968

INVENTOR

PHILIP MENDOLA

BY

John R. Faulkner

Glenn S. Arendsen

ATTORNEYS